(12) United States Patent
Kojima (10) Patent No.: US 8,114,512 B2
(45) Date of Patent: Feb. 14, 2012

(54) ELECTROMAGNETIC SHIELDING SHEET AND METHOD OF FABRICATING THE SAME

(75) Inventor: Hiroshi Kojima, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 610 days.

(21) Appl. No.: 10/519,796

(22) PCT Filed: Aug. 6, 2003

(86) PCT No.: PCT/JP03/10021
§ 371 (c)(1),
(2), (4) Date: Dec. 29, 2004

(87) PCT Pub. No.: WO2004/016059
PCT Pub. Date: Feb. 19, 2004

(65) Prior Publication Data
US 2005/0233132 A1 Oct. 20, 2005

(30) Foreign Application Priority Data
Aug. 8, 2002 (JP) .................................. 2002-230842

(51) Int. Cl.
*B32B 5/16* (2006.01)
*B32B 15/00* (2006.01)
*B32B 15/01* (2006.01)
*B32B 15/02* (2006.01)

(52) U.S. Cl. ................ 428/328; 428/323; 442/6; 442/7; 442/8

(58) Field of Classification Search .................. 428/328, 428/323; 442/6, 7, 8
See application file for complete search history.

(56) References Cited

U.S. PATENT DOCUMENTS
5,158,657 A * 10/1992 Kadokura ...................... 428/324
2003/0094296 A1 * 5/2003 Kojima et al. ............ 174/35 MS

FOREIGN PATENT DOCUMENTS

| EP | 0 831 074 | * | 3/1998 |
|---|---|---|---|
| EP | 0 998 182 A2 | | 5/2000 |
| JP | 62-107039 | * | 5/1987 |
| JP | A-09-298384 | | 11/1997 |
| JP | 10-75087 | | 3/1998 |
| JP | A-11-266095 | | 9/1999 |
| JP | A-2000-223886 | | 8/2000 |
| JP | 2001-217589 | | 8/2001 |
| JP | 2002-190692 | | 7/2002 |
| JP | 2002-196685 | | 7/2002 |
| JP | 2003-37388 | | 2/2003 |
| JP | 2003-304090 | | 10/2003 |
| KR | 10-374222 B | | 12/2000 |

* cited by examiner

*Primary Examiner* — Matthew Matzek
(74) *Attorney, Agent, or Firm* — Oliff & Berridge, PLC (57) ABSTRACT

Blackened layers 23A and 23B are formed by depositing Cu—Co alloy particles on the surfaces of a metal layer 21. The metal layer 21 coated with the blackened layers 23A and 23B of the Cu—Co alloy particles is subjected to a chromating process to form density-intensifying layers 25A and 25B on the blackened layers 23A and 23B. A base 11 is laminated to the density-intensifying layer 25A or 25B. A conductive structure 109 consisting of the meal layer 21, the blackened layers 23A and 23B, and the density-intensifying layers 25A and 25B is processed by a photolithographic process to complete an electromagnetic shielding sheet 1 having a mesh conductive structure.

9 Claims, 3 Drawing Sheets

FIG. 6 ns. Electromagnetic shielding sheets formed by
ELECTROMAGNETIC SHIELDING SHEET AND METHOD OF FABRICATING THE SAME

TECHNICAL FIELD

The present invention relates to an electromagnetic shielding sheet and a method of fabricating the same. More specifically, the present invention relates to an electromagnetic shielding sheet provided with a meshed, thin metal foil (thin film), intended to be disposed in front of a display, such as a cathode-ray tube (CRT) or a plasma display panel (PDP), to shield electromagnetic radiation generated by the display, and capable of enabling the satisfactory visual recognition of images displayed by the display.

BACKGROUND ART

Summary of Techniques

Problems attributable to electromagnetic inference (EMI) have increased with the recent functional progress and spread of electric and electronic devices. Electromagnetic noise is classified roughly into conducted noise and radiated noise. Methods of preventing problems due to conducted noise filter conducted noise with a noise filter. Methods of preventing problems due to radiated noise use a metal case to shield a space electromagnetically, place a metal sheet between wiring boards or coat the wires of cables with a metal foil. Although effective in electromagnetically shielding circuits and power blocks, these methods are unsuitable for shielding electromagnetic radiation generated by the screens of displays, such as CRTs and PDPs, because these methods use opaque means.

The PDP is an assembly of a glass panel provided with data electrodes and a fluorescent layer, and a glass panel provided with transparent electrodes. The PDP generates a large amount of electromagnetic radiation, a large amount of near-infrared radiation and a large amount of heat when operated. Usually, a front panel is disposed in front of the PDP to shield electromagnetic radiation. The front panel must have a shielding function of 30 dB or above in the range of 30 MHz to 1 GHz to shield electromagnetic radiation emitted from the screen of the display. Infrared radiation of wavelengths in the range of 800 to 1,200 nm radiated from the screen of the display must be shielded because infrared radiation makes other devices, such as VTRs, malfunction. The electromagnetic shielding metal mesh (lines) of the electromagnetic shielding sheet must be hardly visible to facilitate the observation of images displayed on the screen of the display, and the electromagnetic shielding sheet must have proper transparency (visible light transmitting property, visible light transmittance) to make images displayed by the display satisfactorily visible. However, there have not been electromagnetic shielding sheets capable of practically providing both the desired electromagnetic shielding property and the desired transparency, not to mention the desired electromagnetic shielding property, the desired transparency and infrared shielding property.

Prior Art

The front panel must be provided with a conductive member for electromagnetic shielding and must have proper transparency (visible light transmittance). That is, the front panel must have both electromagnetic shielding ability and transparency. Conductive members are classified roughly into those including a transparent thin film of a conductive metal or a metal oxide formed on a transparent plate, or those having a mesh structure having fine lines of an opaque conductive material.

The electromagnetic shielding sheet provided with a conductive, transparent thin film of a metal or a metal oxide does not have high electromagnetic shielding ability, but has a high transmittance. Conductive thin film-forming methods disclosed in JP 1-278800 A and JP 5-323101 A form a conductive thin film of a conductive metal or a metal oxide on a transparent base by vapor deposition. While the deposited conductive thin film of the metal or the metal oxide is formed not excessively thick to meet the required transparency, such as a thickness in the range of several hundreds to 2000 Å, the conductive thin film has an excessively high surface electrical resistance and is unsatisfactory in electromagnetic shielding ability.

The electromagnetic shielding sheet provided with a mesh structure having fine lines has high electromagnetic shielding ability, but is subject to limitations on reducing the fineness of the fine lines to increase transmittance. Such fine lines are difficult to form. Electromagnetic shielding sheets formed by embedded fibers having high conductivity in a transparent base are disclosed in JP 5-327274 A and JP 5-269912 A. Though those electromagnetic shielding sheets have satisfactory electromagnetic shielding ability, the regularly arranged conductive fibers for electromagnetic shielding have excessively large diameters not less than 35 μm. Such thick conductive fibers are visible and deteriorate the visibility of displayed images.

Electromagnetic shielding sheets disclosed in JP 62-57297 A and JP 2-52499 A are formed by printing lines of a conductive resin containing metal powder or the like directly on a transparent base plate. The lines of the conductive resin have wide widths on the order of 100 μm due to limited printing accuracy. Such wide lines deteriorate the visibility of displayed images.

To improve the visibility of displayed images, reflection of light from the surface of the conductive film of the electromagnetic shielding sheet must be reduced, and a blackened layer needs to be formed over the surface facing the viewer of the conductive film. An electromagnetic shielding sheet disclosed in JP 5-283889 A has a structure: (base)/(transparent anchor layer)/(electromagnetic shielding layer). The electromagnetic shielding layer has a meshed pattern and is formed by an electroless plating process. The transparent anchor layer underlying the electromagnetic shielding layer is blackened. A reflection reducing method disclosed in JP 61-15480 A forms a copper oxide film on a metal mesh included in an electromagnetic shielding sheet to reduce the reflection of external light. A method disclosed in JP 09-293989 A uses a meshed black resist film used for forming a metal mesh included in an electromagnetic shielding sheet by photolithography as a meshed black frame (lines). An electromagnetic shielding structure disclosed in JP 10-335885 A is formed by laminating a plastic film provided with a copper foil patterned in a geometrical pattern by photolithography to a plastic sheet. However, the density of the black metal meshed frames (lines) of those electromagnetic sheets formed by these prior art methods is low, and the visibility of images displayed by displays provided with these electromagnetic shielding sheets is unsatisfactory.

DISCLOSURE OF THE INVENTION

The present invention has been made to solve those problems and it is therefore an object of the present invention to provide an electromagnetic shielding sheet disposed in front of a display, such as a CRT or a PDP, capable of shielding electromagnetic radiation, and capable of reducing reflection of light from a conductive layer to ensure that the visibility of displayed images is satisfactory, and including a mesh metal foil (thin film) that can be efficiently manufactured by existing equipment, and to provide a method of fabricating such an electromagnetic shielding sheet.

According to the present invention, an electromagnetic shielding sheet includes a transparent base; a mesh metal layer having openings and formed on one of the surfaces of the base; a blackened layer formed on one of the surfaces of the metal layer; and a density-intensifying layer formed on the blackened layer.

The present invention provides the electromagnetic shielding sheet disposed in front of a display, such as a CRT or a PDP, and provided with the mesh metal layer (thin film) capable of shielding electromagnetic radiation, of transmitting image light at a high transmittance, of preventing the reduction of contrast in images due to glare caused by external light, such as sunlight, and of ensuring satisfactory visibility of displayed image.

In the electromagnetic shielding sheet of the present invention, the blackened layer is formed of Cu—Co alloy particles adhering to the metal layer.

In the electromagnetic shielding sheet of the present invention, the Cu—Co alloy particles have a mean particle size in the range of 0.1 to 1 μm.

In the electromagnetic shielding sheet of the present invention, the Cu—Co alloy particles are formed by a cathodic electrodeposition process.

According to the present invention, the uniformly and densely distributed Cu—Co alloy particles improve the visibility of images, and the metal foil can be easily processed without being broken in manufacturing processes. The fine particles can be easily deposited on the metal layer by the cathodic electrodeposition process, and the blackened layer has a high black-intensity and an excellent light-absorbing property.

In the electromagnetic shielding sheet of the present invention, the density-intensifying layer is a chromated layer formed by a chromate treatment.

In the electromagnetic shielding sheet of the present invention, the blackened layer has an excellent density-intensifying effect for intensifying optical density, the metal layer, such as a copper layer, and the blackening Cu—Co alloy particles are not corroded, and the electromagnetic shielding sheet is highly durable.

In the electromagnetic shielding sheet of the present invention, the openings in the mesh metal layer are filled up with a transparent resin such that the surface of the transparent resin filling up the openings is flush with the surface of the metal layer.

In the electromagnetic shielding sheet of the present invention, the transparent resin filling up the openings in the mesh metal layer contains a color tone correcting light-absorbing agent capable of absorbing visible light having wavelengths between 570 nm and 605 nm and/or a near-infrared absorbing agent capable of absorbing infrared radiation having wavelengths between 800 nm and 1100 nm.

The electromagnetic shielding sheet of the present invention further includes a layer containing a color tone correcting light-absorbing agent capable of absorbing visible light having wavelengths between 570 nm and 605 nm and/or a near-infrared absorbing agent capable of absorbing infrared radiation having wavelengths between 800 nm and 1100 nm formed on the surface of either the base or the density-intensifying layer.

The electromagnetic shielding sheet of the present invention is capable of enhancing the visibility of images by preventing the increase of haze due to bubbles contained in an adhesive used for bonding the electromagnetic shielding sheet to a substrate of glass or the like or to the screen of a display. The electromagnetic shielding sheet does not produce moiré when disposed in front of a display, such as a CRT or a PDP, and is capable of shielding unnecessary visible radiation and near-infrared radiation emitted by the display, and of improving the visibility of images displayed by the display.

According to the present invention, an electromagnetic shielding sheet fabricating method includes the steps of: attaching Cu—Co alloy particles to one of the surfaces of a metal foil for forming a metal layer; subjecting the surface of the metal foil coated with the Cu—Co alloy particles to a chromate treatment to form a laminated structure having a density-intensifying layer; adhesively bonding a transparent base with an adhesive to the surface provided with the density-intensifying layer of the laminated structure; forming a resist film having a mesh pattern on the surface, opposite the surface facing the base, of the laminated structure; removing parts, not coated with the resist film, of the laminated structure by etching; and removing the resist film.

The electromagnetic shielding sheet fabricating method according to the present deposits the Cu—Co alloy particles by a cathodic electrodeposition process.

The electromagnetic shielding sheet fabricating method according to the present invention can be continuously and efficiently carried out by existing equipment to fabricate a high-quality electromagnetic shielding sheet at a high yield rate.

BEST MODE FOR CARRYING OUT THE INVENTION

The applicant of this patent application has continuously made R&D activities concerning electromagnetic shielding sheets for displays, and has previously proposed electromagnetic radiation shielding sheets. The applicant proposed an electromagnetic shielding sheet provided with a mesh metal foil formed by blackening and etching in Jpn. Pat. App. No. 2000-019908, and an electromagnetic shielding sheet provided with a mesh metal foil formed by attaching copper particles to a metal foil and etching the metal foil and laminated to a base with an adhesive in Jpn. Pat. App. No. 2001-207930. An electromagnetic radiation shielding sheet of present invention has been made by incorporating improvements into the previously proposed electromagnetic radiation shielding sheets.

An electromagnetic radiation shielding sheet in a preferred embodiment according to the present invention will be described with reference to the accompanying drawings.

Figure 1:
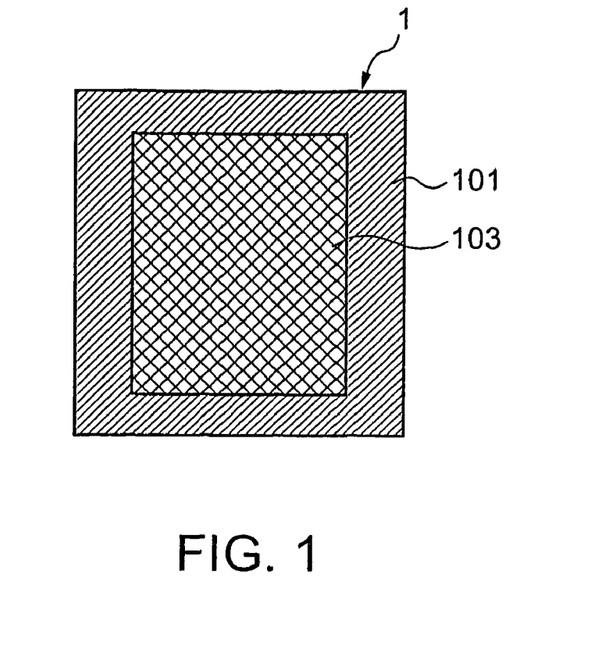
FIG. 1 is a plan view of an electromagnetic shielding sheet according to the present invention.

FIG. 1 is a plan view of an electromagnetic shielding sheet according to the present invention.

Figure 2:
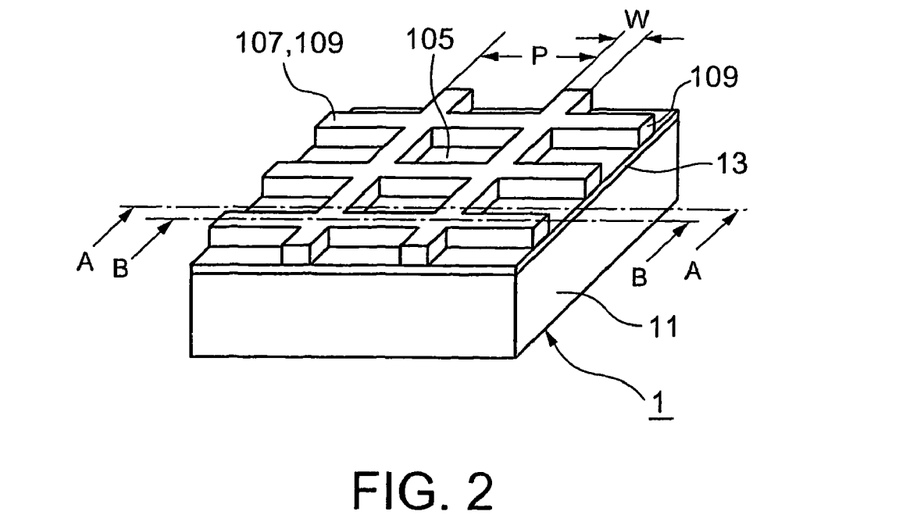
FIG. 2 is a typical perspective view of a part of the electromagnetic shielding sheet shown in FIG. 1.

FIG. 2 is a typical perspective view of a part of the electromagnetic shielding sheet shown in FIG. 1.

General Construction

Referring to FIG. 1, an electromagnetic shielding sheet 1 according to the present invention has a transparent base 11, a mesh structure 103 formed on the base 11, and a grounding frame 101 surrounding the mesh structure 103. As shown in FIG. 2, the mesh structure 103 has intersecting lines 107 defining openings (cells) 105. The grounding frame 101 is connected to a ground when the electromagnetic shielding sheet 1 is combined with a display.

A conductive structure 109 is laminated to one surface of a base 11 with an adhesive layer 13. The conductive structure 109 composes mesh structure having the lines 107. As shown in FIG. 2, the width of the lines 107 is referred to as line width W, and the distance between the similar edges of the adjacent lines 107 is referred to as pitch P.

Figure 3A:
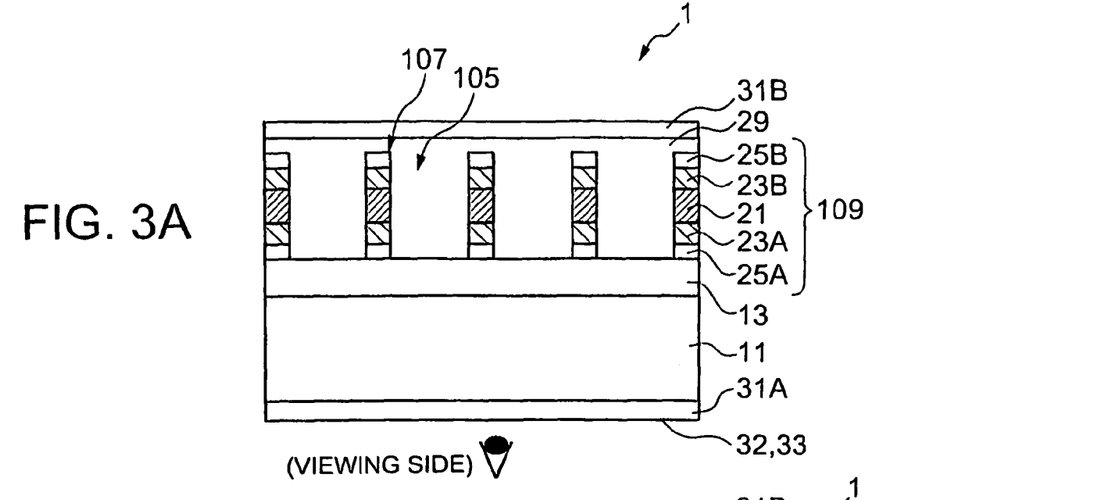
FIG. 3A is a sectional view taken on the line A-A in FIG. 2.
Figure 3B:
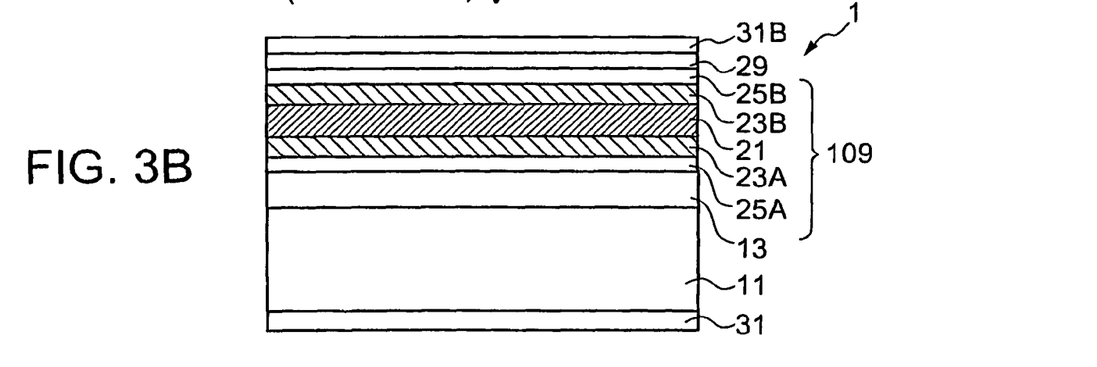
FIG. 3B is a sectional view taken on the line B-B in FIG. 2.

FIGS. 3A and 3B are sectional views taken on the lines A-A and B-B in FIG. 2, respectively. FIGS. 3A and 3B are magnified in a direction along the thickness, i.e., in a vertical direction, to facilitate understanding the construction of the conductive structure 109.

Figure 4:
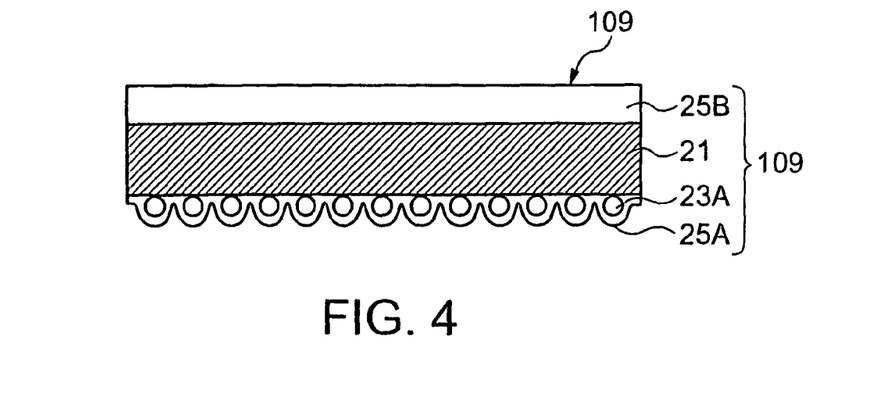
FIG. 4 is a typical sectional view to explain the construction of a conductive structure.

FIG. 4 is a sectional view of assistance in explaining the construction of the conductive structure 109.

Construction of Conductive Structure

As shown in FIG. 3A showing a section in a plane crossing the openings 105, the lines 107 of the conductive structure 109 are arranged continuously. As shown in FIGS. 3A, 3B and 4, the conductive structure 109 has a metal layer 21, and a blackened layer 23A formed by attaching Cu—Co alloy particles to one of the surfaces of the metal layer 21. A density-intensifying layer 25A is formed so as to cover the Cu—Co alloy particles. The density-intensifying layer 25A intensifies the optical density (black density) of the blackened layer 23A. Moreover, in most cases, the density-intensifying layer 25A is rustproof. Preferably, the density-intensifying layer 25A is a layer of copper and/or nickel and/or zinc oxide or a chromated layer.

When necessary, a blackened layer 23B and a density-intensifying layer 25B may be formed on the other surface, not coated with the blackened layer 23A, of the metal layer 21. When the blackened layers 23A and 23B are formed on both the surfaces of the metal layer 21, respectively, the density-intensifying layers 25A and 25B may be formed on the surfaces of the blackened layers 23A and 23B, respectively.

Fabricating Method

Figure 6:
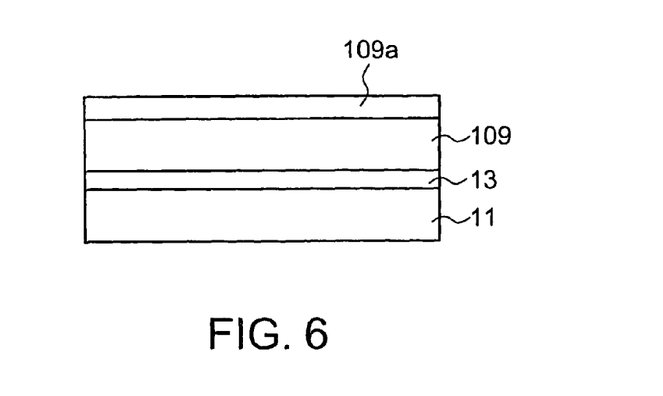
FIG. 6 is a typical side elevated view to explain an electromagnetic shielding sheet fabricating method according to the present invention.

In fabricating the electromagnetic shielding sheet 1 of the present invention, the conductive structure 109 is laminated to one of the surfaces of the base 11, i.e., a transparent film, with an adhesive layer 13, and a resist film 109a having a meshed pattern is formed over the conductive structure 109 as shown in FIG. 6. A photolithographic process is carried out to remove parts of the conductive structure 109 not coated with the resist film 109a by etching, and then the resist film 109a is removed. Most of those processes are successively carried out to fabricate the electromagnetic shielding sheet in a high quality at a high yield rate and at a high production efficiency (FIG. 6).

Point of the Invention

The conductive structure 109 of the electromagnetic shielding sheet 1 of the present invention is formed by forming the blackened layer 23A and/or the blackened layer 23B of the Cu—Co alloy particles on the metal layer 21, and forming the density-intensifying layer 25A and/or the density-intensifying layer 25B by a chromate treatment or the like. The conductive structure 109 is laminated to the base 11, i.e., a transparent film with the adhesive layer 13, and then the conductive structure 109 is patterned in the meshed pattern by a photolithographic process. When necessary, the mesh surface of the conductive structure 109 is flattened. When necessary, a light-absorbing layer capable of absorbing visible light of a specific wavelength and/or near-infrared radiation is formed on the conductive structure 109. When this electromagnetic shielding sheet having proper transparency is disposed in front of a display, the electromagnetic shielding sheet shields electromagnetic radiation generated by the display. The blackened layers 23A and 23B and the density-intensifying layers 25A and 25B absorb external light fallen on the meshed surface and do not reflect the external light fallen on the meshed surface toward the viewer to prevent the external light from reducing contrast in images. Consequently, images have satisfactory visibility.

In the electromagnetic shielding sheet fabricating method of the present invention, the conductive layer 109 is laminated to the base 11, and is subjected the surface of the conductive layer 109 to a photolithographic process. Those processes can be successively carried out by existing equipment to fabricate the electromagnetic shielding sheet in a high quality at a high yield rate and at a high production efficiency.

Fabricating Method

A representative electromagnetic shielding sheet fabricating method of the present invention includes the following steps.

(a) Conductive Structure Forming Step

The blackened layer 23A or 23B of the Cu—Co alloy particles is formed at least on one of the surfaces of the metal layer 21, i.e., a metal foil to construct the conductive structure 109.

(b) Density-Intensifying Layer Forming Step

The density-intensifying layer 25A or 25B is formed at least on the surface, coated with the blackening layer, of the metal layer 21 by a chromate treatment.

(c) Laminating Step

The base 11 is laminated to the density-intensifying layer 25A or 25B with the adhesive layer 13.

(d) Photolithographic Step

Te resist film 109a having a meshed pattern is formed over the conductive structure 109, a photolithographic process is carried out to remove parts of the conductive structure 109 not coated with the resist film 109a by etching, and then the resist film 109a is removed.

The method of forming a mesh having densely arranged openings is an application of a photolithographic process. The sequence of those steps, the steps and materials will be described.

(A) Conductive Structure Forming Step

In the conductive structure forming step, the conductive structure 109 is formed by forming the blackening layer 23A or 23B at least on one of the surfaces of the metal layer 21.

Metal Layer

The metal layer 21 of the conductive structure 109 capable of shielding electromagnetic radiation has conductivity sufficient for shielding electromagnetic radiation and is formed of gold, silver, copper, iron, aluminum, nickel or chromium. Usually, the metal layer 21 is a metal foil formed by a rolling process or an electrolytic process. A blackening layer is formed on the metal layer 21 and the metal layer 21 is laminated to the base. The metal layer may be formed on the base by electroless plating or the like. The metal layer 21 may be a single layer or a laminated layer, and may be formed of an alloy. Iron base metals suitable for forming the metal layer 21 are low-carbon steels, such as low-carbon rimmed steels and low-carbon aluminum-killed steels, Ni—Fe alloys, and Invar. When cathodic electrodeposition is used, copper or copper alloy foils are desirable. The copper foils may be rolled copper foils and electrolytic copper foils. Electrolytic copper foils are preferable because electrolytic copper foils have a uniform thickness, have a satisfactory property to adhere to blackened layers and/or layers formed by a chromate treatment, and are capable of being formed in thin films of a thickness not greater than 10 μm. The thickness of the metal layer 21 is in the range of about 1 to about 100 μm, preferably, in the range of 5 to 20 μm. Although the metal layer 21 can be easily processed by photolithography to form the mesh structure if the thickness of the metal layer 21 is less than the lower limit of the thickness range, a mesh structure formed by processing the metal layer 21 having such a small thickness has a large electrical resistance that reduces the electromagnetic shielding effect. If the metal layer 21 has a thickness greater than the upper limit of the thickness range, a desired fine mesh structure cannot be formed and, consequently, the mesh structure has a low real ratio of open area and a low transmittance, visual angle decreases, and the visibility of images becomes low.

Preferably, the metal layer 21 has a surface roughness Rz between 0.5 and 10 μm. The metal layer 21 reflects external light in a specular reflection mode deteriorating the visibility of images if the surface roughness thereof is below 0.5 μm even if the surface of the metal layer 21 is blackened. The adhesive and the resist cannot be uniformly spread over the entire surface of the metal layer 21, bubbles are formed in the adhesive and the resist if the surface roughness of the metal layer 21 is greater than 10 μm. The surface roughness Rz is the mean of roughness values of ten points measured by a surface roughness measuring method specified in B0601, JIS.

Blackening Treatment

The surface, facing the viewing side, of the metal layer 21 of the meshed conductive structure 109 needs to be processed by a blackening treatment to improve the visibility of images and to increase contrast in images by absorbing external light, such as sunlight and light emitted by a lamp, falling on the electromagnetic shielding sheet 1. The blackening treatment roughens and/or blackens the surface of the metal layer 21. The blackening treatment can be achieved by any one of various methods. For example, in the blackening treatment, a metal oxide, such as silver oxide, cobalt oxide or chromium oxide, or a metal sulfide, such as palladium sulfide, nickel fuloride, copper sulfide or titanium sulfide, is formed over the surface of the metal layer 21. If the metal layer 21 is formed of iron, an oxide film (blackening film) of a thickness between about 1 μm and about 2 μm is formed by exposing the metal layer 21 to steam of a temperature in the range of 450° C. to 470° C. for a period in the range of 10 to 20 min. An oxide film (blackening film) may be formed by chemically processing the metal layer 21 with a chemical, such as concentrated nitric acid. If the metal layer 21 is a copper foil, it is preferable to attach cationic particles to the metal layer 21 by a cathodic electrodeposition process using an electrolytic solution containing sulfuric acid, copper sulfate and cobalt sulfate. The cationic particles adhering to the surface of the metal layer 21 increases the surface roughness of the metal layer 21 and blackens the surface of the metal layer 21. The cationic particles may be copper particles or copper alloy particles. Copper-cobalt alloy particles are preferable.

The cathodic electrodeposition process is capable of depositing particles having particle sizes included in a narrow range and having a mean particle size in the range of 0.1 to 1 μm. When current is supplied to the metal layer 21 in a high current density, the surface of the metal layer 21, such as a copper foil, becomes cathodic and is activated by reducing hydrogen to increase the adhesion of particles to the metal layer 21, such as a copper foil, remarkably.

Thus, the blackened layers 23A and 23B are formed on the metal layer 21 by the blackening treatment.

In this specification, the blackening treatment includes roughening and blackening. A preferable optical density of the blackened layer is 0.6 or above. Optical density is measured by using COLOR CONTROL SYSTEM GRETAG SPM100-11® (Kimoto Co.). Measurement of the optical density of a specimen uses an angle of observation field of 10°, a light source D50, and an illumination type T specified in the ANSI standards. The specimen is subjected to measurement after white calibration. Preferably, the reflectance of the surface processed by the blackening treatment is 5% or below. Reflectance is measured by using Haze Meter HM150® (Murakami Sikisai) by a method specified in K7105, JIS.

Alloy Particles

The applicant of this patent application previously proposed copper particles as alloy particles for the blackening treatment in Jpn. Pat. App. No. 2001-207930, and found that Cu—Co alloy particles have a very high blackening effect. Cu—Co alloy particles may be subjected to a blackening treatment. The optical characteristics representing the image visibility improving effect of the electromagnetic shielding sheet are expressed by the color system "L*, a*, b*, ΔE*" specified in Z8729, JIS. The conductive structure 109 becomes more invisible when the absolute values of a* and b* are smaller. Consequently, contrast in images is enhanced and the visibility of images is improved.

Point of the Invention

Very fine Cu—Co alloy particles of uniform particle sizes can be deposited in high density. A blackened layer formed by depositing such Cu—Co alloy particles is satisfactory and absorbs light efficiently. Concrete examples will be described later.

Preferably, the mean particle size of the Cu—Co alloy particles is in the range of 0.1 to 1 μm. Cu—Co alloy particles having a mean particle size exceeding the upper limit of the desired range reduces the thickness of the metal layer 21 excessively and, consequently, it is possible that the metal foil is broken in laminating the same to the base 11, workability is deteriorated, and the surface of the metal layer 21 lacks fineness and has an uneven appearance because the particles are not formed compactly. Cu—Co alloy particles having a mean particle size below the lower limit of the range lack roughening effect and hence the visibility of images is unsatisfactory (B) Density-Intensifying Layer Forming Step The density-intensifying layer forming step forms the density-intensifying layers 25A and 25B on the blackened layers 23A and 23B of the metal layer 21.

The density-intensifying layers 25A and 25B are formed so as to coat the blackened layers 23A and 23B formed in the metal layer 21. The density-intensifying layers are formed at least on the surfaces of the metal layer 21 coated with the blackened layers 23A and 23B. The blackened layers 23A and 23B and the density-intensifying layers 25A and 25B may be formed on both the surfaces of the metal layer 21 or either the blackened layer 23A or 23B, and either the density-intensifying layer 25A or 25B may be formed on one of the surfaces of the metal layer 21 as the occasion demands.

The density-intensifying layers 25A and 25B formed on the blackened layers 23A and 23B intensifies the blackness of the blackened layers 23A and 23B. The density-intensifying layers 25A and 25B also have functions to prevent the metal layer 21 and the blackened layers 23A and 23B from rusting and to prevent the blackened layers 23A and 23B from coming off and being deformed. The density-intensifying layers 25A and 25B may be layers of oxides of nickel, zinc and/or copper, or layers formed by a chromate treatment. The layers of oxides of nickel, zinc and/or copper can be formed by a known plating process. The thickness of the layers of oxides of nickel, zinc and/or copper is in the range of about 0.001 to about 1 µm, preferably, in the range of 0.001 to 0.1 µm.

Chromate Treatment

In the chromate treatment, a workpiece is wetted with a chromating solution. The chromating solution may be applied to the workpiece by a roll-coating method, a curtain-coating method, a squeeze-coating method, an electrostatic atomization method or a dipping method. The workpiece treated by the chromate treatment is dried without rinsing. A roll-coating method is preferable when only one of the surfaces of the workpiece is to be treated by the chromate treatment. A dipping method is preferable when both the surfaces of the workpiece are to be treated by the chromate treatment. Usually, the chromating solution is a $CrO_2$ solution having a $CrO_2$ concentration of 3 g/l. A chromating solution obtained by adding an oxycarboxylic compound to a chromic anhydride solution to reduce part of hexavalent chromium into tervalent chromium may be used. The surface of the workpieces treated by the chromate treatment is colored in a color of a color category including light yellow and yellowish brown depending on the amount of deposited hexavalent chromium. Since tervalent chromium is colorless, a film formed by the chromate treatment has practically acceptable transparency when the ratio between the respective amounts of tervalent chromium and hexavalent chromium is controlled properly. Suitable oxycarboxylic compounds are tartaric acid, malonic acid, citric acid, lactic acid, glycolic acid, glyceric acid, tropic acid, benzilic acid and hydroxyvalerianic acid. Those chemicals may be used individually or in combination. Since the different compounds have different reducing effects, the amount of the compound added to the chromic anhydride solution must be determined according to the rate of reduction of hexavalent chromium into tervalent chromium.

Practically, a chromating agent, ALSURF 1000® (Nippon Paint) and a chromating agent, PM-284® (Nippon Parkerizing) are used. The chromate treatment applied to the blackened layer has an effect of enhancing the effect of the blackening treatment an antirust effect.

The blackened layer and the antirust layer may be formed at least on the surface on the viewing side. Since the blackened layer and the density-intensifying layer prevent the reflection of incident external light, such as sunlight and light emitted by lamps, by the lines 107 to improve contrast in images and to improve the visibility of displayed images. The blackened layer and the antirust layer may be formed on the other surface on the side of the display to shield stray light emitted by the display and thereby the visibility of images is improved.

(C) Base Laminating Step

In the base laminating step, the transparent base 11 is laminated to the conductive structure 109 coated with the blackened layer and the density-intensifying layer with the adhesive layer 13.

Base

The base 11 may be formed of any one of various materials, provided that the materials have desired transparency, desired insulating property, desired heat resistance and desired mechanical strength. Suitable materials for forming the base 11 are, for example, polyester resins including polyethylene terephthalate resins, polybutylene terephthalate resins, polyethylene naphthalate resins, polyethylene terephthalate-isophthalate copolymers, terephthalate-cyclohexanedimethanol-ethylene glycol copolymers and polyethylene terephthalate/polyethylene naphthalate resins for coextrusion, polyamide resins including nylon 6, nylon 66 and nylon 610, polyolefin resins including polypropylene resins and poly(methyl pentene) resins, vinyl resins including polyvinyl chloride resins, acrylic resins including polyacrylate resins, polymethacrylate resins and poly(methylmethacrylate) resins, engineering plastics including polyarylate resins, polysulfone resins, poly(ether sulfone) resins, polyphenylene ether resins, polyphenylene sulfide resins (PPSs), polyaramid resins, poly(ether ketone) resins, polyether nitrile resins, poly(ether ether ketone) resins and polyether sulfide resins, and styrene resins including polycarbonate resins and polystyrene resins.

The base 11 may be formed of a copolymer containing some of the foregoing resins as principal components, a mixture of some of the foregoing resins or an alloy of some of the foregoing resins. The base 11 may be a laminated sheet. Although the base 11 may be either an oriented film or an unoriented film, it is preferable, in view of mechanical strength, that the base 11 is a uniaxially oriented film or a biaxially oriented film. The thickness of the base 11 is in the range of about 12 to about 1000 µm, preferably, in the range of 50 to 700 µm. The most desirable thickness of the base 11 is in the range of 100 to 500 µm. If the base 11 is excessively thin, the base 11 has an insufficient mechanical strength and warps or sags. If the base 11 is excessively thick, the base 11 has an over quality and is uselessly expensive.

The base 11 is a film, a sheet or a board having at least one layer of one of those resins. In this specification, a film, a sheet and a board will be referred to inclusively as "film". Polyester films, such as polyethylene terephthalate films and polyethylene naphthalate films, are suitable films as the base 11 because polyester films are satisfactory in transparency and heat resistance and inexpensive. Polyethylene terephthalate films are most suitable. Although films having higher transparency are more desirable, films having a visible light transparency of 80% or above are acceptable.

The surface of the base may be altered by surface treatment to render the surface receptive to the adhesive layer. The surface treatment may be corona discharge treatment, plasma treatment, ozone treatment, flame treatment, coating with a primer, i.e., anchoring agent, adhesion promoting agent or adhesive receptivity improving agent, preheating, dust removing treatment, deposition treatment or alkali treatment. When necessary, the resin film may contain additives, such as a filler, a plasticizer, an antistatic agent and a UV absorbent.

Laminating Process

In the laminating process, the adhesive layer 13 is formed on one of the surfaces of the base 11 or the conductive structure 109, the adhesive layer 13 is dried when necessary, and a pressure is applied to a laminated structure formed by superposing the base 11 and the conductive structure 109 with either heating or not heating the laminated structure to bond together the base 11 and the conductive structure 109 with the adhesive layer 13. The laminated structure may be subjected to aging at a temperature in the range of 30° C. to 80° C. if necessary. If the base 11 is formed of a resin that becomes adhesive when heated, such as an ionomer, an ethylene-vinyl acetate copolymer or an ethylene acrylate copolymer, or if the base 11 is a laminated film having a layer formed of such a resin, the base 11 and the conductive structure 109 can be laminated without using any adhesive simply by superposing the base 11 and the conductive structure 109 and applying pressure to the superposed base 11 and the conductive structure 109 under heat. The metal layer 21 can be directly formed on the base 11 by electroless plating or vacuum deposition without using any adhesive.

Adhesive

Any suitable adhesive may be used. Suitable adhesives are, for example, acrylic resins, polyester resins, urethane resins, and polyvinyl chloride-acetate resins. Dry lamination using a thermosetting resin having satisfactory processability and resistant to the coloring and deteriorative effects of an etchant is preferable. A UV-curable resin curable by irradiation with ionizing radiation, such as UV radiation, is preferable.

In a dry lamination process for laminating two films, adhesive layers are formed on the films by applying an adhesive solution prepared by dissolving an adhesive in a solvent to the films and drying the adhesive solution, the films are laminated to form a laminated film, and the laminated film is subjected to aging at a temperature in the range of 30° C. to 120° C. for several hours to several days to cure the adhesive. A nonsolvent lamination process developed by improving the dry lamination process may be employed. In the nonsolvent lamination process, an adhesive is spread instead of the adhesive solution over films, the adhesive is dried, the films are laminated in a laminated film and the laminated structure is subject to aging at a temperature in the range of 30° C. to 120° C. for several hours to several days to cure the adhesive so that the films are bonded together.

An adhesive suitable for the dry lamination process or the nonsolvent lamination process is a thermosetting adhesive or an ionizing-radiation-curable adhesive that can be cured with ionizing radiation, such as UV radiation or electron beams. Suitable thermosetting adhesives are two-part adhesives, such as urethane adhesives including acryl-urethane adhesives, polyester-urethane adhesives and polyether-urethane adhesives, acrylic adhesives, polyester adhesives, polyamide adhesives, polyvinyl acetate adhesives, epoxy adhesives and rubber adhesives. Two-part urethane adhesives are preferable.

A suitable two-part urethane adhesive is, for example, a polymer obtained through the reaction of a polyfunctional isocyanate with a hydroxyl-terminated compound. Suitable polyfunctional isocyanates are, for example, aromatic polyisocyanates, such as tolylenediisocyanate, diphenylmethane diisocyanate and poly(methylene-phenylene) polyisocyanate, or polyfunctional isocyanates, such as aliphatic (or alicyclic) polyisocyanates including hexamethylene diisocyanate, xylylene di-isocyanate isophorone di-isocyanate. Those polyisocyanates may be polymers (trimers) and addition polymers of those isocyanates. Suitable hydroxyl-terminated compounds are polyether polyol, polyester polyol and polyacrylate polyol. A two-part urethane resin obtained by reacting polyfunctional isocyanate with a hydroxyl-terminated compound may be used.

Preferable adhesive is obtained by mixing a polyester polyurethane resin denatured by a styrene-maleic acid copolymer resistant to the coloring and deteriorative effects of an etchant, and an aliphatic polyisocyanate resin.

In the dry lamination process, an adhesive composition containing the foregoing materials as principal components in an organic solvent is dissolved or dispersed to produce an adhesive liquid, a film is coated with a film of the adhesive liquid by a coating method, such as a roll coating method, a reverse-roll coating method, a gravure roll coating method, a gravure reverse-roll coating method, a gravure offset coating method, a kiss coating method, a wire bar coating method, a comma coating method, a knife coating method, a dip coating method, a flow coating method or a spray coating method, and the solvent is removed by drying the film of the adhesive liquid to form the adhesive layer 13 for dry lamination. A roll coating method or a reverse-roll coating method is preferable.

The thickness of the dry adhesive layer 13 is in the range of about 0.1 to about 20 µm, preferably, in the range of 1 to 10 µm. The base is laminated to the conductive structure immediately after the formation of the adhesive layer, and a laminated structure thus formed is subjected to aging at a temperature in the range of 30° C. to 120° C. for several hours to several days to cure the adhesive layer so that the base and the conductive structure are bonded together. The adhesive layer may be formed on either the base or the metal layer. Preferably, the adhesive layer is formed on the metal foil so as to cover the roughened surface of the metal foil entirely to prevent formation of bubbles in the laminated structure.

Although the nonsolvent lamination process and the dry lamination process are basically the same, in the nonsolvent lamination process, the adhesive composition is used directly without dissolving or dispersing the adhesive composition is used in a solvent. When necessary, the adhesive composition is heated to decrease the viscosity of the adhesive composition.

Adhesive

The adhesive may be a known pressure-sensitive adhesive. There are not particular restrictions on the adhesive. The adhesive may be any one of suitable resins. Suitable adhesives are natural rubber, synthetic rubbers including butyl rubbers, polyisoplene rubbers, polyisobutylene rubbers, polychloroprene rubbers and styrene-butadiene copolymers, silicone resins including dimethyl polysiloxane resins, acrylic resins, vinyl acetate resins including polyvinyl acetate resins and ethylene-vinyl acetate copolymers, urethane resins, acrylonitrile resins, hydrocarbon resins, alkylphenol resins, and rosin resins including rosin, rosin triglyceride reins and hydrogenated rosin.

Rubber Adhesive

Effective rubber adhesive is a mixture of one or some of adhesives including chloroprene rubber, acrylonitrile-butadiene rubber, acrylic rubber, styrene-butadiene rubber, styrene-isoprene-styrene rubber, styrene-butadiene-styrene rubber, styrene-ethylene-butadiene rubber, butyl rubber, polyisobutylene rubber, natural rubber and polyisoprene rubber, and one or some of tackfiers including phenol resins, modified phenol resins, ketone resins, alkyd resins, rosin resins, coumarone resins, styrene resins, petroleum resins and vinyl chloride reins.

The rubber adhesives are superior to acrylic adhesives in chemical resistance, swelling resistance, heat resistance, tackiness and peeling strength. Therefore, layers bonded with the rubber adhesive will not peel off even if the same are exposed to acid or alkali solutions. The rubber adhesive is scarcely subject to hydrolysis in acid or alkali solutions, and maintains its adhesive property for a long time.

Adhesive Layer

A latex, an aqueous dispersion or an organic solution of one or some of the foregoing resins is spread in an adhesive film on the surface of one of two layers to be bonded together by a known printing method, such as a screen printing method or a comma coating method, or a known coating method, the adhesive film is dried when necessary, and then the other layer is pressed against the former layer.

Figure 5A:
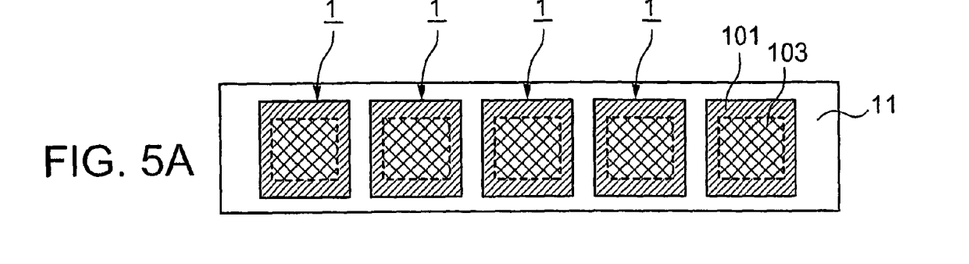
FIG. 5A is a plan view to explain a method of processing a rolled continuous film.
Figure 5B:
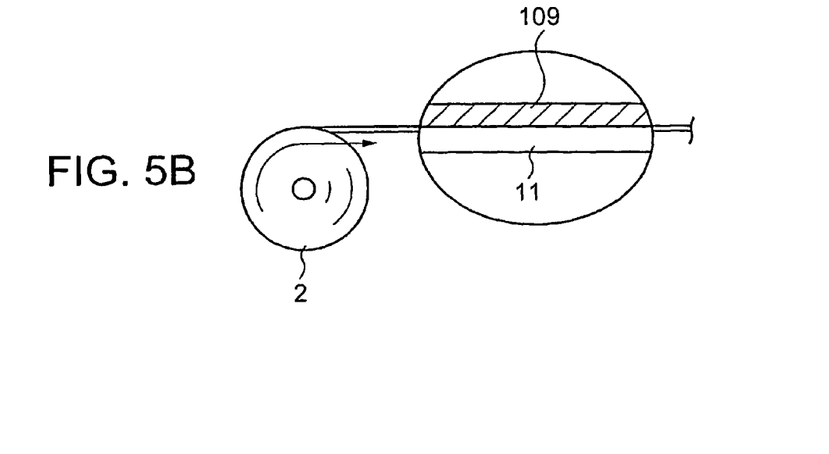
FIG. 5B is a partly enlarged side elevated view to explain the method of processing a rolled continuous film.

FIGS. 5A and 5B are a plan view and a side elevation, respectively, of assistance in explaining a method of processing a rolled continuous film.

A roll of a continuous film is used for forming laminated structures. In FIG. 5A, the electromagnetic shielding sheets 1 are formed at predetermined intervals on the continuous film unwound from a roll. FIG. 5B shows the conductive structure 109 laminated to the base 11.

The conductive structure 109 is formed by forming the blackened layers and the density-intensifying layers on the metal layer 21. The adhesive layer is formed on the density-intensifying layer of the conductive structure 109 by spreading an adhesive in an adhesive film on the surface of the density-intensifying layer and drying the adhesive film. The conductive structure 109 is bonded to the base 11 by pressing the same against the base 11. When necessary, a laminated structure formed by bonding together the conductive structure 109 and the base 11 is aged (cured) at a temperature in the range of 30° C. to 80° C. for several hours to several days, and the laminated structure is wound in a roll 2.

(D) Photolithographic Step

A resist film 109a having a predetermined mesh pattern is formed on the conductive structure 109 laminated to the base 11 as shown in FIG. 6, parts of the conductive structure 109 not coated with the resist film are removed by etching, and the resist film 109a is removed to complete a meshed conductive structure.

Masking

The conductive structures of the continuous laminated structure formed by bonding together the base 11 and the conductive structures 109 and unwound from a roll are processed by photolithography to form mesh conductive structures 109. The continuous laminated structure is processed for masking, etching and resist film removal while the same is kept taut and fed continuously or intermittently.

Masking, for example, a photoresist film is formed over the entire surface of the conductive structure 109, dries the photoresist film is dried, a mask having a predetermined pattern (pattern of meshes defined by lines) is put on the photoresist film, the photoresist film is exposed through the mask in the predetermined pattern of lines defining meshes, the exposed photoresist film is developed, the developed photoresist film is treated by a hardening treatment and the patterned photoresist film is baked.

The resist film is formed on the surface of the conductive structure 109 by applying the photoresist, such as casein, a PVA or gelatin, to the surface of the conductive structure 109 by a dipping method, a curtain coating method or a flow coating method while the laminated structure formed by laminating the base 11 and the conductive structures 109 is unwound from the roll and fed continuously or intermittently. The resist film may be formed by attaching a dry resist film to the conductive structure 109 instead of applying the liquid resist to the conductive structure 109. The baking temperature is in the range of 200° C. to 300° C. when a casein resist is used. It is preferable to bake the laminated structure at the lowest possible temperature to prevent the laminated structure from warping.

Etching Process

The resist film is etched after masking the same with the mask. A ferric chloride solution and a cupric chloride solution, which are easy to circulate, are preferable for a continuous etching process. Basically, the etching process is similar to an etching process using a shadow mask forming system for etching a continuous thin steel sheet of a thickness in the range of 20 to 80 µm to form shadow masks for CRTs of color TV sets. The etching process can be carried out by an existing shadow mask forming system, and a series of steps from a masking step to an etching process can be very efficiently continuously carried out. The laminated structure is washed with water, the resist film is removed with an alkali solution, the laminated structure is washed again, and then the laminated structure is dried.

Mesh Structure

A mesh structure 103 has lines 107 defining openings 105. There are not particular restrictions on the shape of the openings 105. The openings 105 may have a triangular shape, such as the shape of an equilateral triangle or an isosceles triangle, a quadrilateral shape, such as the shape of a square, a rectangle, a rhombus or a trapezoid, a polygonal shape, such as the shape of a pentagon, a hexagon or an octagon, a circular shape or an elliptic shape. The openings 105 form a mesh. The line width is 25 µm or below, preferably, 20 µm or below to secure a proper ratio of open area and to make the mesh invisible, and pitches of the lines is 150 µm or above, preferably, 200 µm or above to secure a proper transmittance.

Although the lines shown in FIG. 1 are bias lines inclined to the lower side of the electromagnetic shielding sheet at 45°, the angle of the lines to the lower side is not limited thereto and may be selectively determined takina into consideration the arrangement of pixels and the light emitting characteristic of the associated display to prevent the formation of moiré.

Flattening

The lines 107 of the mesh structure 103 have a height corresponding to the thickness of the conductive structure 109, and parts of the conductive structure 109 are removed to form the recesses. Thus, the conductive structure 109 has an irregular surface. When an adhesive or a pressure-sensitive adhesive is applied to the irregular surface of the conductive structure 109 by the next process, the recesses are filled up with the adhesive. It often occurs that air filling up the recesses is not completely replaced with the adhesive and bubbles are formed in the adhesive filling up the recesses. The interfaces between the bubbles and the adhesive scatter light to increase haziness (or cloudiness). Therefore, it is desirable to flatten the surface of the conductive structure 109 by filling up the recesses with a transparent resin to prevent such a problem.

The recesses are filled up with a transparent resin for flattening. Bubbles are contained in the transparent resin to decrease transparency unless the recesses are filled up completely with the transparent resin. Therefore, a transparent resin diluted with a solvent and having a low viscosity is applied to the surface of the conductive structure 109 in a resin film, and the resin film is dried to form the flattening layer 29, or the resin is applied to the surface of the conductive structure 109, deaerating the same to form the flattening layer 29.

The flattening layer 29 may be formed of any suitable resin, provided that the resin has a high transparency, and sufficiently adhesive to the metal forming the mesh structure and to an adhesive to be used by the next process. If projections or recesses are formed in the surface of the flattening layer 29 and the surface of the flattening layer 29 undulates, moiré, interference fringes and/or Newton rings are formed when the electromagnetic shielding sheet is disposed in front of a display. It is preferable to apply a thermosetting or UV-curable resin to the conductive structure 109, to attach a flat release sheet to the surface of the resin layer, to cure the resin layer by heating or irradiation with UV radiation, and to remove the release sheet from the cured resin layer. The flat surface of the release sheet is transferred to the flattening layer 29 to form a flat surface.

The flattening layer 29 may be formed of any suitable resin, such as a natural resin, a synthetic resin, a thermosetting resin or an ionizing-radiation-curable resin. In view of durability, applicability and flattening property, suitable materials for forming the flattening layer 29 are UV-curable acrylic resins.

Near-Infrared Absorbing Layer

The resin forming the flattening layer 29 may contain a light-absorbing agent capable of absorbing visible and/or near-infrared radiation in a specific wave band. An unpleasant feeling caused by displayed images is suppressed and the visibility of displayed images is improved by absorbing visible and/or infrared radiation in a specific wave band. The specific wave band of the wavelengths of near-infrared radiation is between about 780 nm and about 1200 nm, more strictly, between 800 nm and 1200 nm. It is desirable to absorb 80% or above of near-infrared radiation having wavelengths in a wave band of 800 nm to 1200 nm. Although any suitable near-infrared absorbing agent (also referred to as "NIR absorbent") may be used, a suitable near-infrared absorbing agent is, for example, a coloring matter having peak electromagnetic absorption wavelengths in the near-infrared wave band, a high light transmittance in the visible region and not having a specific peak electromagnetic absorption wavelength in the visible region. Usually, visible light emitted by a PDP contains a large amount of orange light having a spectrum corresponding to the emission spectrum of neon atoms. Therefore, it is desirable that the flattening layer 29 contains a color tone correcting light-absorbing agent that absorbs some of visible light having wavelengths in the range of about 570 nm to about 605 nm. Suitable NIR absorbents include cyanine compounds, phthalocyanine compounds, naphthalocyanine compounds, naphthoquinone compounds, anthraquinone compounds, dithiol complexes, immonium compounds and di-immonium compounds. Phthalocyanine compounds are suitable color tone correcting light absorbing agents. Although the flattening layer 29 contains the NIR absorbent in this embodiment, a near-infrared absorbing layer (NIR absorbing layer) containing a NIR absorbent may be formed on at least one of the surfaces of the conductive structure 109.

NIR Absorbing Layer

NIR absorbing layers may be formed on the surfaces of the flattening layer 29 and the base 11, or a NIR absorbing layer may be formed on the surface of the flattening layer 29 or the base 11. A NIR absorbing layer 31A is formed on the base 11 as shown in FIG. 3A. A NIR absorbing layer 31B is formed on the surface of the flattening layer 29 as shown in FIG. 3A. The NIR absorbing layers 31A and 31B may be NIR absorbing films on the market, such as Film No. 2832 commercially available from Toyobo, bonded to the base 11 and the flattening layer 29 with an adhesive or may be films of a binder containing the aforesaid NIR absorbent. Suitable binders include polyester resins, polyurethane resins, acrylic resins and thermosetting or UV-curable resins utilizing the reaction of epoxy groups, acrylate groups, methacrylate groups or isocyanate groups.

Antireflection Layer

An antireflection layer (AR layer) 32 may be formed on a surface, on the viewing side, of the electromagnetic shielding sheet 1. The AR layer prevents reflecting visible light. There are various commercially available single-layer and multiple-layer antireflection films. A multiple-layer antireflection film consists of alternate high-diffraction and low-diffraction layers. Suitable high-diffraction layers are those of niobium oxide, titanium oxide, zirconium oxide and ITO. Suitable low-diffraction layers are those of silicon oxide, magnesium fluoride and such.

Hard Coating Layer, Antifouling Layer, Antiglare Layer

A hard Coating layer, an antifouling layer and an antiglare layer 33 may be formed on the antireflection layer 32. The hard coating layer has a hardness not lower than a hardness H determined by a pencil hardness test method specified in K 5400, JIS. The hard coating layer is formed by heating or irradiating with ionizing radiation a film of a polyfunctional acrylate resin, such as a polyester acrylate resin, a urethane acrylate resin or an epoxy acrylate resin. The antifouling layer is a water-repellent, oil-repellent coating of a siloxane compound or a fluorinated alkylsilyl compound. The antiglare layer has a minutely roughened surface capable of reflecting external light in a diffused reflection mode.

Cutting

A continuous base sheet on which electromagnetic shielding structures are formed is unwound from a roll and the continuous base sheet is cut to provide individual electromagnetic shielding sheets 1. A front plate for a display is formed by attaching the electromagnetic shielding sheet 1 to a transparent substrate, such as a glass substrate. When necessary, an antireflection layer, a hard coating layer, an antifouling layer and/or an antiglare layer is laminated to the electromagnetic shielding sheet 1 to form a front panel for a display. A rigid transparent substrate of a thickness in the range of 1 to 10 mm is used for forming a front panel for a large display. A plastic film of a thickness in the range of 0.01 to 0.5 mm is used as a transparent substrate for forming a front panel for a small display, such as a character indicator or the like. Thus, a proper transparent substrate is used selectively according to the size and use of the display.

Electromagnetic sheets in examples will be described.

Example 1

A conductive structure was formed by subjecting a 10 μm thick electrolytic Cu foil, which serves as a metal layer 21, to a cathodic electrodeposition process to form blackened layers 23A and 23B consisting of Cu—Co alloy particles having a mean particle size of 0.3 μm on the Cu foil, and a chromating treatment to form density-intensifying layers on the blackened layers 23A and 23B. A 100 μm thick transparent, biaxially oriented PET film A4300® (Toyobo) as a base was laminated to the surface treated by the chromating treatment of the Cu foil with a two-part polyurethane adhesive. A structure formed by laminating the PET film and the Cu foil was aged at 50° C. for three days. The two-part adhesive includes TAKERAKKU A-310® (polyol) (Takeda Yakuhin Kogyo) as an adhesive resin, and Hardener A-10® (isocyanate) (Takeda Yakuhin Kogyo) as a hardener. The two-part adhesive was spread in a 4 μm thick film in a dry state.

The structure formed in a continuous laminated film was masked and etched by a photolithographic process to form meshes. The photolithographic process was carried out by a shadow mask manufacturing line for manufacturing shadow masks for color TV sets. A photoresist film of casein was formed over the entire surface of the conductive structure formed in the laminated film by a flow coating method. The laminated film was fed intermittently to the next station. The laminated structure was exposed to light emitted by a mercury lamp through a photomask having a negative pattern for forming 22 μm wide lines defining square openings, arranged at pitches of 300 μm and inclined at 49°. The laminated structure was processed at the following stations for developing, hardening and baking at 100° C.

Subsequently, parts of the Cu foil and those of the blackened layer corresponding to the openings were removed by a spray etching process using a ferric chloride solution heated at 50° C. and having a Baumé degree of 420 as an etchant. The laminated film was processed by the following processes at the following stations for washing, resist film removal, rinsing and drying at 100° C. to complete electromagnetic shielding sheets in Example 1.

Comparative Example 1

Electromagnetic shielding sheets in Comparative example 1 were fabricated by the same method as that of forming the electromagnetic shielding sheets in Example 1, except that the electromagnetic sheets in Comparative example 1 had a 10 μm thick Cu foil having surfaces coated with blackened layers formed by an oxidizing process instead of blackened layers of Cu—Co alloy particles formed by a chromating treatment.

Comparative Example 2

Electromagnetic shielding sheets in Comparative example 2 were fabricated by the same method as that of forming the electromagnetic shielding sheets in Example 1, except that the electromagnetic sheets in Comparative example 2 had blackened layers of Cu—Co alloy particles having a mean particle size of 2 μm instead of Cu—Co alloy particles having a mean particle size of 0.3 μm.

Evaluation

The electromagnetic shielding sheets in Example 1 and Comparative examples 1 and 2 were evaluated in terms of the adhesion of the Cu—Co alloy particles, the breakage of the Cu foils, contrast in images, and the evenness and color tone of images. Color tone was measured by a color difference meter, Color Computer® (Suga Shiken-ki) and represented by the color system "Lightness L*, Chromaticity a*, b*, Color difference ΔE*". Color tone was evaluated by a colorimetric system L*a*b* and a colorimetric system L*u*v* specified in Z8729, JIS. The adhesion of the Cu—Co alloy particles was evaluated through the visual observation of specimens after etching. The Cu foils were observed to see whether or not the Cu foils were broken while the same were processed by electromagnetic shielding sheet fabricating line from a resist application process to a drying process. The evenness of images was evaluated on the basis of measured values of L*, a*, b*, ΔE*. Measured results are shown in Table 1.

| Evaluation Criteria | | Example 1 | Comparative example 1 | Comparative example 2 |
|---|---|---|---|---|
| Processing suitability | Separation of particles | None | None | None |
| | Foil breakage during processing | None | None | occur |
| | Irregularities in images | None | None | occur |
| Visibility after lamination | L+ | 28.960 | 36.208 | — |
| | a+ | 0.262 | 5.194 | — |
| | b+ | 1.1825 | 6.609 | — |
| | ΔE+ | 28.985 | 37.153 | — |
| Visibility after etching | L+ | 41.899 | 42.010 | — |
| | a+ | 0.074 | 0.542 | — |
| | b+ | 0.487 | 1.406 | — |
| | ΔL+ | 41.901 | 42.037 | — |

Results of Evaluation

The electromagnetic shielding sheets in Example 1 and Comparative example 1 were satisfactory in processing suitability. The density of the blackened layers of the electromagnetic shielding sheets in Example 1 was high as compared with that of the electromagnetic shielding sheets in Comparative example 1, and hence "a*, b*" of images was small, and images observed through the electromagnetic shielding sheets in Example 1 were excellent in visibility and contrast as compared with those observed through the electromagnetic shielding sheets in Comparative example 1. The electromagnetic shielding sheets of the present invention provided with the blackened layers of the Cu—Co alloy particles are excellent in processing suitability and effect on improving the visibility of images.

Example 2

Electromagnetic shielding sheets in Example 2 were fabricated by the steps of coating the surfaces of the mesh structures of the electromagnetic shielding sheets in Example 1 with a film of a flattening composition, laminating a 50 μm thick SP-PET20-BU® (Tosero), i.e., a PET film having a surface having a release characteristic, to the surface of the film of the flattening composition, exposing the thus coated electromagnetic shielding sheets to radiation of an intensity of 200 mj/cm$^2$ (in terms of 365 nm) emitted by a high-pressure mercury lamp, and removing the SP-PET20-BU. The electromagnetic shielding sheets in Example 2 had abilities similar to those of the electromagnetic shielding sheets in Example 1.

The flattening composition was prepared by mixing 20 parts by mass of N-vinyl-2-pyrrolidone, 25 parts by mass dicyclopentenyl acrylate, 52 parts by mass oligoester acrylate (M-8060®, To a Gosei), and 3 parts by mass 1-hydroxycyclohexyl phenylketone (IRUGACURE 184, ciba-Geigy).

Example 3

Electromagnetic shielding sheets in Example 3 were fabricated similarly to those in Example 2, except that the electromagnetic shielding sheets in Example 3 had a flattening layer formed of a material prepared by adding one part by mass thiol-nickel complex, i.e., a near-infrared absorbing agent. The electromagnetic shielding sheets in Example 3 had abilities similar to those of the electromagnetic shielding sheets in Example 1, and an effect on improving the visibility of displayed images higher than that of Example 1.

Example 4

Electromagnetic shielding sheets in Example 4 were the same as those in Example 2, except that NIR Film No. 2832® (Toyobo), i.e., a near-infrared absorbing film, was laminated to the surface of the flattening layer with an adhesive. The electromagnetic shielding sheets in Example 4 had abilities similar to those of the electromagnetic shielding sheets in Example 1, and an effect on improving the visibility of displayed images higher than that of Example 1.

The electromagnetic shielding sheets of the present invention are disposed in front of displays to shield electromagnetic radiation generated by the displays. The electromagnetic shielding mesh metal frame (lines) are scarcely visible and controls the reflection of external light to enhance contrast in displayed images. The lines of the mesh structure have both an electromagnetic shielding ability and a high transparency, and improves the visibility of displayed images. The electromagnetic shielding sheet of the present invention can be fabricated by the existing equipment, and the mesh structure can be efficiently formed by continuous processes by a photolithographic method.

The invention claimed is:

1. An electromagnetic shielding sheet comprising:
a transparent base;
a mesh metal layer having openings and formed on one of the surfaces of the base;
a blackened layer formed on one of the surfaces of the metal layer; and
a density-intensifying layer formed on the blackened layer for intensifying black density of the blackened layer,
wherein the blackened layer is formed of Cu—Co alloy particles adhering to the metal layer, the density-intensifying layer is a chromated layer formed by a chromate treatment and so that the Cu—Co alloy particles are prevented from coming off from the mesh metal layer by the chromated layer.

2. The electromagnetic shielding sheet according to claim 1, wherein the Cu—Co alloy particles have a mean particle size in the range of 0.1 to 1 μm.

3. The electromagnetic shielding sheet according to claim 1, wherein the Cu—Co alloy particles are formed by a cathodic electrodeposition process.

4. The electromagnetic shielding sheet according to claim 1, wherein the openings in the mesh metal layer are filled up with a transparent resin such that the surface of the transparent resin filling up the openings is flush with the surface of the metal layer.

5. The electromagnetic shielding sheet according to claim 4, wherein the transparent resin filling up the openings in the mesh metal layer contains a color tone correcting light-absorbing agent capable of absorbing visible light having wavelengths between 570 nm and 605 nm and/or a near-infrared absorbing agent capable of absorbing infrared radiation having wavelengths between 800 nm and 1100 nm.

6. The electromagnetic shielding sheet according to claim 1 further comprising:
a layer containing a color tone correcting light-absorbing agent capable of absorbing visible light having wavelengths between 570 nm and 605 nm and/or a near-infrared absorbing agent capable of absorbing infrared radiation having wavelengths between 800 nm and 1100 nm formed on the surface of either the base or the density-intensifying layer.

7. An electromagnetic shielding sheet fabricating method comprising the steps of:
attaching Cu—Co alloy particles to one of the surfaces of a metal foil for forming a metal layer;
subjecting the surface of the metal foil coated with the Cu—Co alloy particles to a chromate treatment to form a laminated structure having a density-intensifying layer for intensifying black density of the blackened layer so that the Cu—Co alloy particles are prevented from coming off from the mesh metal layer by the chromated layer;
adhesively bonding a transparent base with an adhesive to the surface provided with the density-intensifying layer of the laminated structure;
forming a resist film having a mesh pattern on the surface of the laminated structure opposite the surface facing the base;
removing parts of the laminated structure not coated with the resist film by etching; and
removing the resist film.

8. The electromagnetic shielding sheet fabricating method according to claim 7, wherein the Cu—Co alloy particles are deposited by a cathodic electrodeposition process.

9. The electromagnetic shielding sheet according to claim 1, wherein the density-intensifying layer has a thickness from 0.001 to 0.1 μm.

* * * * *